(12) United States Patent
Hwu et al.

(10) Patent No.: US 6,929,961 B2
(45) Date of Patent: Aug. 16, 2005

(54) DUAL FUNCTION ARRAY FEATURE FOR CMP PROCESS CONTROL AND INSPECTION

(75) Inventors: Justin Jia-Jen Hwu, San Jose, CA (US); Thomas L. Leong, San Jose, CA (US)

(73) Assignee: Hitachi Global Storage Technologies Netherlands B. V., Amsterdam (NL)

( * ) Notice: Subject to any disclaimer, the term of this patent is extended or adjusted under 35 U.S.C. 154(b) by 5 days.

(21) Appl. No.: 10/733,980

(22) Filed: Dec. 10, 2003

(65) Prior Publication Data

US 2005/0130331 A1 Jun. 16, 2005

(51) Int. Cl.[7] .............................................. H01L 21/00
(52) U.S. Cl. ................................ 438/8; 438/16; 438/7; 438/690; 438/691; 438/692
(58) Field of Search ............................... 438/105, 7, 8, 438/16, 690, 691, 692

(56) References Cited

U.S. PATENT DOCUMENTS

| | | | |
|---|---|---|---|
| 5,177,559 A | 1/1993 | Batchelder et al. | 356/237 |
| 5,834,159 A | 11/1998 | Stolmeijer | 430/312 |
| 5,917,588 A | 6/1999 | Addiego | 356/237 |
| 6,166,801 A | 12/2000 | Dishon et al. | 355/27 |
| 6,300,248 B1 * | 10/2001 | Lin et al. | 438/692 |
| 6,303,507 B1 * | 10/2001 | Wang et al. | 438/692 |
| 6,379,868 B1 | 4/2002 | White | 430/311 |
| 6,433,561 B1 | 8/2002 | Satya et al. | 324/753 |
| 6,445,199 B1 | 9/2002 | Satya et al. | 324/753 |
| 6,472,662 B1 | 10/2002 | Archie | 250/307 |
| 6,509,197 B1 | 1/2003 | Satya et al. | 438/12 |
| 6,528,818 B1 | 3/2003 | Satya et al. | 257/48 |
| 6,586,336 B2 * | 7/2003 | Jeong | 438/692 |
| 2002/0156594 A1 | 10/2002 | Houge et al. | 702/127 |
| 2002/0170021 A1 | 11/2002 | Houge et al. | 716/4 |
| 2002/0187582 A1 | 12/2002 | Satya et al. | 438/48 |
| 2002/0197872 A1 * | 12/2002 | Hollatz et al. | 438/692 |
| 2003/0064594 A1 * | 4/2003 | Delage et al. | 438/691 |
| 2003/0076989 A1 | 4/2003 | Maayah et al. | 382/145 |
| 2003/0124856 A1 * | 7/2003 | Kneer | 438/692 |
| 2003/0211743 A1 * | 11/2003 | Chang et al. | 438/692 |
| 2004/0166686 A1 * | 8/2004 | Lin et al. | 438/692 |

FOREIGN PATENT DOCUMENTS

| | | |
|---|---|---|
| EP | 0973069 A2 | 1/2000 |
| WO | WO 84/01212 | 3/1984 |
| WO | WO 85/03353 | 8/1985 |
| WO | WO 98/20327 | 5/1998 |
| WO | WO 01/80304 A2 | 10/2001 |

* cited by examiner

Primary Examiner—Matthew Smith
Assistant Examiner—Victor V Yevsikov
(74) Attorney, Agent, or Firm—Robert O. Guillot; Intellectual Property Law Offices

(57) ABSTRACT

CMP process control array groups are fabricated upon the surface of the wafer for viewing through an optical microscope. The array groups include a plurality of test arrays, where each array includes a plurality of projecting test features. Each of the projecting test features are formed with the same projecting height and have a hard upper surface layer, such as diamond-like-carbon (DLC). All of the projecting test features within an array are formed with the same diameter, and the diameter of projecting test features of a particular array differs from the diameter of projecting test features in another array. The diameters are chosen such that the DLC surface is removed in specifically designed time increments, such as 5 seconds, from array to array, where projecting test features with the DLC surface removed appear as bright white, while the arrays with test features that retain some DLC surface are significantly darker.

22 Claims, 4 Drawing Sheets

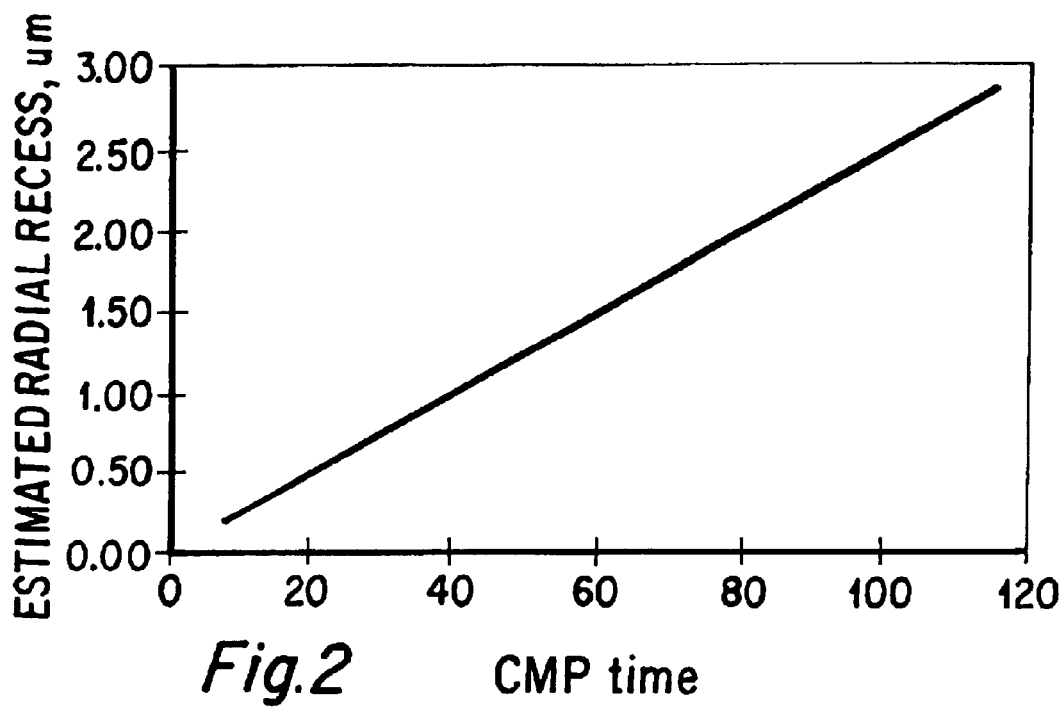
Fig.2
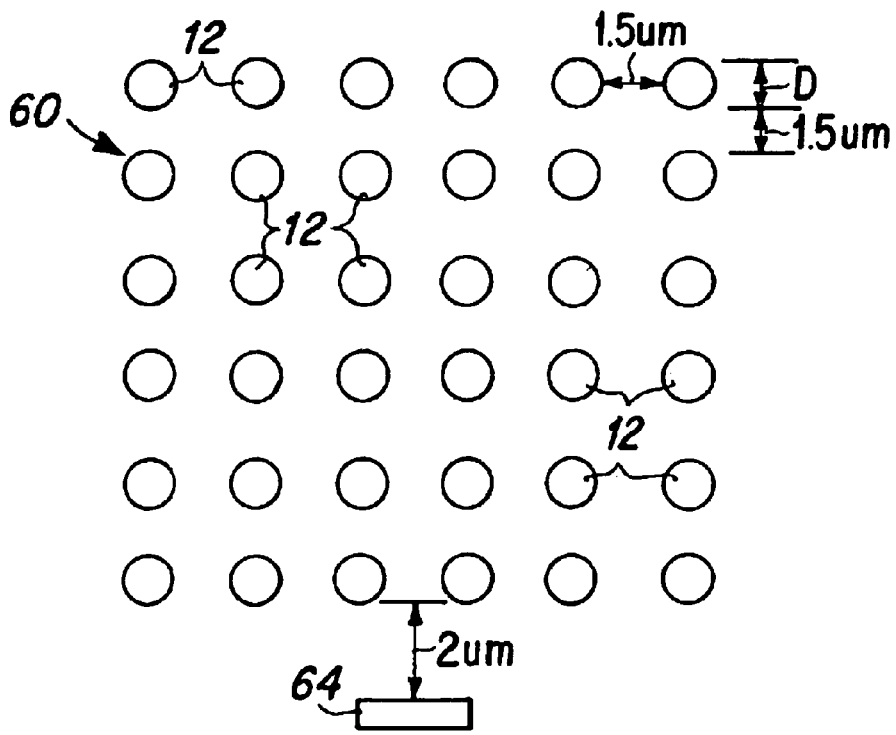
Fig.3 D=1.5, 1.6 um

D=1.9, 2.2, 2.5 um.

D=2.8, 3.1, 3.4 um.

DUAL FUNCTION ARRAY FEATURE FOR CMP PROCESS CONTROL AND INSPECTION

BACKGROUND OF THE INVENTION

1. Field of the Invention

The present invention relates generally to chemical mechanical polishing (CMP) process control, and more particularly to a CMP process control feature suitable for both optical microscope inspection and critical dimension scanning electron microscope inspection and measurement.

2. Description of the Prior Art

In the fabrication of thin film devices such as magnetic heads for hard disk drives, one or more chemical mechanical polishing (CMP) steps are often undertaken to remove portions of existing surface features and obtain a generally flat, smooth surface upon which to fabricate further thin film layers and structures. As is well known to those skilled in the art, where a CMP step is undertaken above delicate structures, such as the sensor layer structure of a read head portion of a magnetic head, accurate process control must be maintained, such that the CMP step is conducted for sufficient time to remove the unwanted surface layers or features, while not overpolishing and removing the desired delicate structures. The delicate surface structures are so small, generally measuring less than a micron, that process control must typically be conducted using a critical dimension scanning electron microscope (CDSEM). The use of the CDSEM for process control increases equipment expenses and is time consuming, and therefore slows manufacturing throughput during the fabrication process. Additionally, because skilled operators are required to operate a CDSEM properly, the expense of the fabrication process is increased. The present invention provides a solution to these problems by enabling the use of an optical microscope which generally has a small feature limit of approximately 20 microns in process control related to these structures that are too small to be viewed by the optical microscope.

SUMMARY OF THE INVENTION

In the present invention, CMP process control array groups are fabricated upon the surface of the wafer for viewing through an optical microscope as an indication of the progress of a CMP polishing step. The process control array groups include a plurality of test arrays, where each array includes a plurality of projecting test features. All of the projecting test features within an array are formed with the same diameter, and the diameter of projecting test features of a particular array differs from the diameter of projecting test features in another array.

Each of the projecting test features within all of the arrays are formed with the same projecting height and have a hard upper surface layer, such as diamond-like-carbon (DLC). Significantly, it has been determined that the erosion rate of the DLC layer during a CMP polishing step is approximately constant, regardless of the diameter range chosen for the projecting test features, and the DLC erosion rate corresponds to the rate of polishing on the critical device features in a linear manner. Therefore, projecting test features of one array can be fabricated with a diameter chosen such that the DLC surface of the projecting test features is eroded in a particular time, such as 40 seconds. The projecting test features of an adjacent array can be fabricated with a larger diameter that is chosen such that the DLC surface is completely removed in a different time, such as 45 seconds. Thus, a series of arrays can be arranged next to each other, where the diameters of the projecting test features are chosen such that the DLC surface of the projecting test features is removed in specifically designed time increments, such as 5 second increments, from array to array.

It is to be understood that each of the projecting test features is too small to be viewed utilizing an optical microscope. However, where a plurality of such test features is created in close proximity to each other, such as in an array, which may have area of approximately 400 square microns, and therefore the entire array is visible utilizing an optical microscope. A dark field optical microscope is preferably utilized, as the arrays having projecting test features with the DLC surface completely removed appear as bright white, while the arrays with test features that retain some DLC surface are significantly darker. The operator, viewing through the dark field optical microscope, can count the number of arrays that reveal a high image contrast, thereby indicating the corresponding CMP process progress.

As a result, CMP process control of delicate features that are too small to be viewed utilizing an optical microscope, can be obtained by fabricating arrays that include a plurality of projecting test features which when viewed together in an array are visible utilizing the dark field optical microscope. CDSEM methodology may also be used as a complimentary tool for further process diagnostic and fine tuning. The overall benefit of this method is that it combines a quick and simple CMP process control at an operator level utilizing a dark field optical microscope, and a precise CMP process engineering level fine tuning utilizing a CDSEM when it is needed.

It is an advantage of the CMP control process of the present invention that a relatively inexpensive optical microscope can be utilized to provide CMP process control of delicate features that are too small to be seen utilizing an optical microscope.

It is another advantage of the CMP control process of the present invention that the polishing of features that are only a fraction of a micron in size can be controlled utilizing a conventional optical microscope.

It is a further advantage of the CMP process control of the present invention that a plurality of arrays can be created on a wafer surface that provide a time intervalled polishing indication.

It is yet another advantage of the CMP control process of the present invention that a more rapid, less expensive method for polishing control is provided.

It is yet a further advantage of the CMP control process of the present invention that it combines a quick and simple CMP process control at an operator level utilizing optical microscopes, and a precise CMP process engineering fine tuning utilizing a CDSEM when it is needed.

These and other features and advantages of the present invention will no doubt become apparent to those skilled in the art upon reading the following detailed description which makes reference to the several figures of the drawing.

IN THE DRAWINGS

The following drawings are not made to scale as an actual device, and are provided for illustration of the invention described herein.

FIG. 2 is a chart depicting the relationship between radial recess of a DLC layer formed upon the upper surface of a round component, such as are depicted in FIG. 1, versus CMP polishing time;

FIG. 3 depicts an array of relatively small diameter projections;

DETAILED DESCRIPTION OF THE PREFERRED EMBODIMENTS

Chemical mechanical polishing (CMP) steps are commonly undertaken during the fabrication of thin film devices such as magnetic heads for hard disk drives. Where delicate structures are involved, such as the read sensors of a giant magnetoresistive read head, the CMP step must be closely monitored to remove the unwanted material while not also removing the desired read head structure. The process control for such a CMP step is generally conducted using a critical dimension scanning electron microscope (CDSEM). A skilled operator is generally required to operate the CDSEM and significant time is involved in this process control step. The present invention allows the utilization of an optical microscope to control the CMP step, such that a less trained operator can conduct process control, and less time and expense is involved in controlling the CMP step.

As will be understood from reading this detailed description, the present invention utilizes grouped arrays of small projecting test features, where the individual projecting test features within an array are so small as to only be viewable utilizing a CDSEM, whereas the grouped arrays of these small test features are large enough to be viewed using an optical microscope. Because the polishing effects upon the individual projecting test features are predictable, and the arrays of test features are viewable utilizing an optical microscope, the CMP process can be accurately monitored by the relatively rapid use of an optical microscope, as opposed to the more time consuming and expansive use of the CDSEM. A more rapid process turnaround time is thereby achieved utilizing the present invention, such that a greater throughput of fabricated parts is obtained. The polishing characteristics of the projecting test features that form the basis of the present invention are first described with the aid of FIG. 1.

Figure 1:
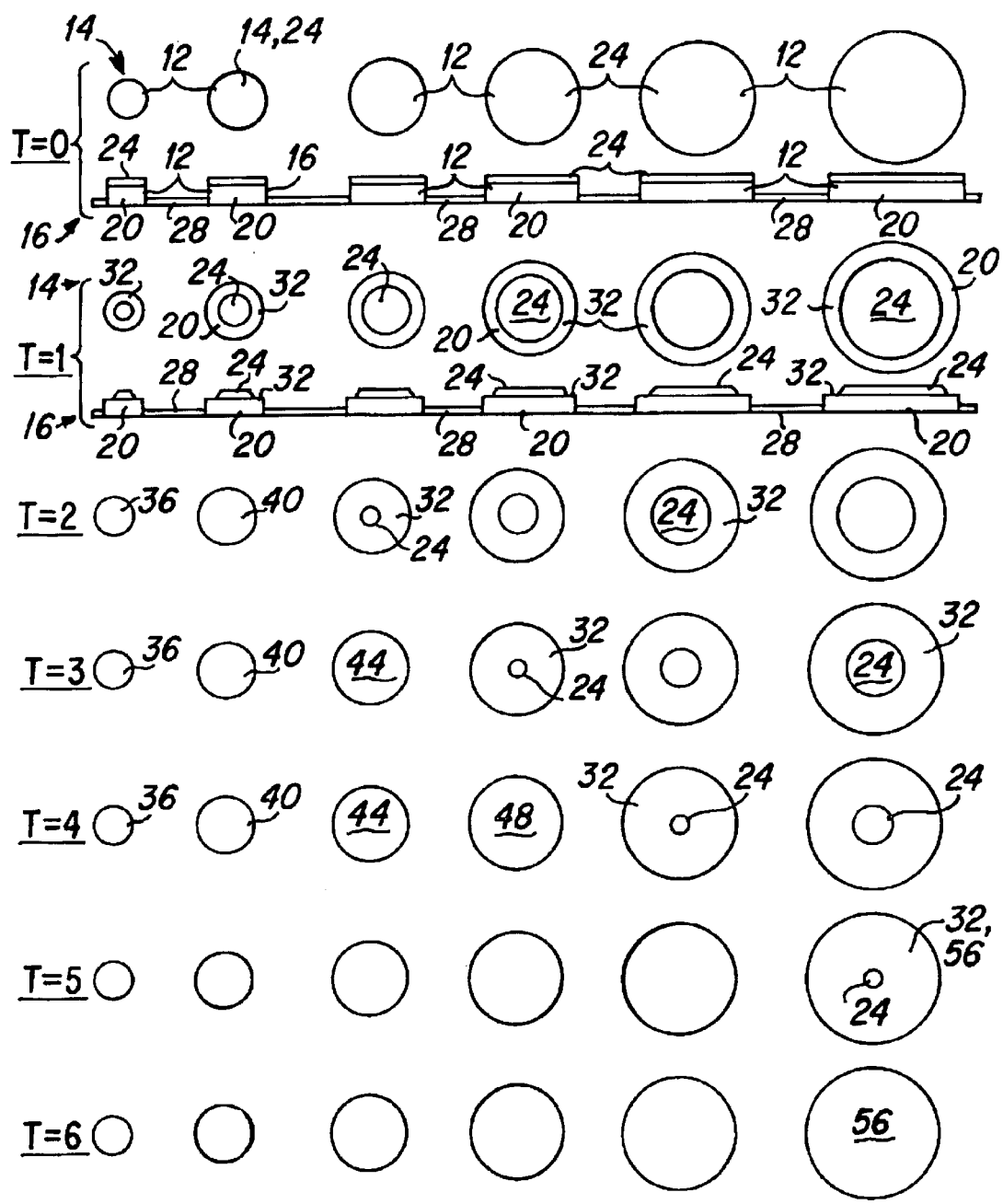
FIG. 1 is a diagram generally depicting the effect of chemical mechanical polishing (CMP) on generally round features that are fabricated upon a wafer substrate for polishing end point determinations.

FIG. 1 is a diagram depicting a plurality of generally round projecting test features that are shown at a plurality of time increments (T=0 through T=6). With reference to the T=0 line of FIG. 1, a plurality of projecting test features 12 are shown in a top view row 14 and a side elevational view row 16. Each test feature 12 generally comprises a base portion 20, which may be comprised of a typical wafer fabrication deposition substance such as alumina or tantalum or rhodium, and an upper thin film layer 24 composed of a hard substance such as diamond-like-carbon (DLC). As shown in the T=0 line, each of the test features 12 is fabricated with a different diameter, with the DLC thin film surface formed thereon. Additionally, where the DLC thin film 24 is deposited across the wafer surface, a DLC thin film portion 28 will exist between each of the projecting test features 12.

The fabrication of the projecting test features 12 can be accomplished in several ways, such as by the deposition of the base layer 20 across the wafer surface, followed by the photolithographic definition of test features 12, then followed by a reactive ion etch (RIE)/ion mill step to remove unprotected areas outside of the projecting test features. Argon, oxygen, fluorine and fluorine/based gasses are commonly used as etching gasses, depending upon the selection of materials used for forming the projecting test features 12. After the RIE/ion mill step, the resist is stripped and a thin layer of DLC is deposited across the wafer and onto the projecting test features. The projecting test features are now ready as the T–0 test features for CMP process control, as is next described.

It has been determined that when test features, such as the test features 12 depicted in the T=0 line, are subject to a CMP step, that the erosion or removal of the DLC 24 occurs from the outer edges of the test features, and that the erosion is generally equal and uniform across the features, regardless of their diameter. Thus, as depicted in FIG. 1, at a CMP polishing time of T=1, outer edge portions of the DLC layer 24 have been removed from the edges of each of the projecting test features, and an outer ring 32 of the base material 20 becomes visible in the top plan view depicted for T=1. It is to be noted that the critical device features, such as a read head layer, is formed concurrently with the formation of the projecting test features 12, and the DLC layer is deposited across the critical features in the same step that it is deposited upon the test features 12. A typical thickness range of the DLC layer is 50–100 nanometers.

As depicted in FIG. 1, at a further CMP polishing time of T=2, it can be seen in the top plan view of the test features that the DLC film has been completely eroded from the first two (narrower diameter) projecting test features 36 and 40, whereas some DLC layer 24 remains in the central portions of the four larger diameter test features. Thereafter, at CMP polishing time T=3, it is seen that the DLC thin film has been removed from the three smaller diameter test features 36, 40 and 44, whereas the three larger diameter test features still have some centrally disposed DLC 24. At CMP polishing time T=4, the four left hand, smaller diameter, projecting test features 36, 40, 44 and 48 have no DLC remaining, whereas the two right hand, larger diameter test features still have some centrally located DLC. Still later, at CMP polishing time T=5, only the largest diameter projecting test feature 56 has some centrally located DLC 24. Finally, at CMP polishing time T=6 (or beyond) the polishing has finally removed all of the DLC from even the largest diameter projecting test feature 56. It can therefore be understood that for a particular CMP process (having a particular type of polishing slurry and CMP process parameters), the polishing time necessary to completely remove the DLC layer from the projecting test feature surfaces is a function of the diameter of the test features. FIG. 2 provides a graphical depiction of this relationship, as is next described.

FIG. 2 is a graph depicting the relationship between the radial recess of a DLC layer 24 upon a projecting test feature 12 as a function of CMP process time. It can be seen that the radial removal of DLC is a generally linear function of time; for instance, it can be seen that for a CMP process time of 40 seconds a radial recess of approximately 0.5 microns was determined by CDSEM measurement. This data would mean that a circular projecting test feature 12 having a diameter of approximately 1 micron would have all of the DLC layer removed from it's surface in 40 seconds of this CMP process.

The data provided by a chart such as FIG. 2 for a particular CMP processing step can be utilized in a first step in the development of the present invention. Particularly, from a chart such as FIG. 2, it is determined that a projecting test feature of the type depicted in FIG. 1 and having a diameter of approximately 1 micron, if observed in a CDSEM device, will act as a 40 second CMP processing time indicator (radial recesses of 0.5 microns) when all of the DLC is removed from its surface. Likewise, a projecting test feature having a diameter of approximately 1.5 microns, if observed utilizing a CDSEM device would provide a CMP processing time indication of 60 seconds when it is observed that the DLC has been completely removed from its surface. Similarly, a projecting test feature having a diameter of approximately 2 microns will provide an indication of a CMP process time of 80 seconds when the DLC is completely removed from it.

Therefore, utilizing this data relationship of FIG. 2, for this particular CMP processing step, a plurality of DLC coated projecting test features 12 can be fabricated upon a wafer having diameters that correspond to particularly chosen polishing time increments, such as diameters being chosen for 5 second increments. When such a plurality of projecting test features having specifically chosen diameters are fabricated upon the wafer surface, the process development engineer, utilizing a CDSEM microscope, can look at the test features to determine the process stage of the CMP step. For instance, where it has been previously determined using a CDSEM that a CMP step related to a delicate surface feature (such as a magnetic head read sensor) should be conducted for approximately 50 seconds, projecting test features can be fabricated upon the wafer surface having appropriate diameters relating to polishing times of 35 seconds, 40 seconds, 45 seconds, 50 seconds, 55 seconds, 60 seconds and 65 seconds. Thereafter, utilizing the CDSEM to view the tiny projecting test features, the progress of the CMP polishing step can be monitored.

That is, where the DLC has been removed from just the 30 second, 35 second and 40 second projecting test features, a CDSEM observing operator viewing the test features, would know that further process is required to reach the desired end point corresponding to 50 seconds. Further polishing is then conducted and the wafer is checked again utilizing the CDSEM device to reveal that the DLC has been removed from the 45 second projecting test feature (and most of the DLC has been removed from the 50 second projecting test feature), whereupon the operator, through use of the CDSEM device has determined that the polishing endpoint has effectively been reached. Significantly, if the operator utilizing the CDSEM device were to observe that the DLC had also been fully removed from the 50 second, and 55 second projecting test features, the operator would realize that the wafer has been over polished, such that the sensitive device features have themselves been polished and thereby destroyed, whereupon the wafer is irretrievably damaged and must be discarded. A CDSEM measurement on the projecting test features can yield feedback information such as verifying the current CMP polishing rate, verifying the CMP polishing rate during a new head design that includes a new material or a new geometry that results in a CMP recess rate change, and additionally, the CDSEM recessed measurement obtained on current arrays serves as a design guide for new array combinations that suit a new CMP process control for a new head design.

The above described CMP control process would be time consuming and expensive, because it requires the use of the CDSEM device due to the extremely small size of the projecting test features. As is next described, the present invention permits the usage of the far quicker, simpler optical microscope to check the wafer polishing progress and control the CMP step.

FIG. 3 depicts an array 60 of identical diameter projecting test features 12. The array is generally square, having a side dimension of approximately 20 $\mu$m, such that its area is approximately 400 $\mu m^2$; it is formed with six rows, where each row includes six identically diametered projecting test features 12. The projecting test features are spaced equidistant from each other, and this six by six array is preferably utilized where the projecting test features have a relatively small diameter, such as 1.5 $\mu$m and the spacing between the adjacent test features is approximately 1.5 $\mu$m. It is also preferable that an array identification symbol 64 be created proximate the array, such as at a distance of approximately 2 microns beneath the array, such that the array 60 (and therefore the test feature diameter of the array) can be identified by a CDSEM through pattern recognition on symbol 64.

Figure 4:
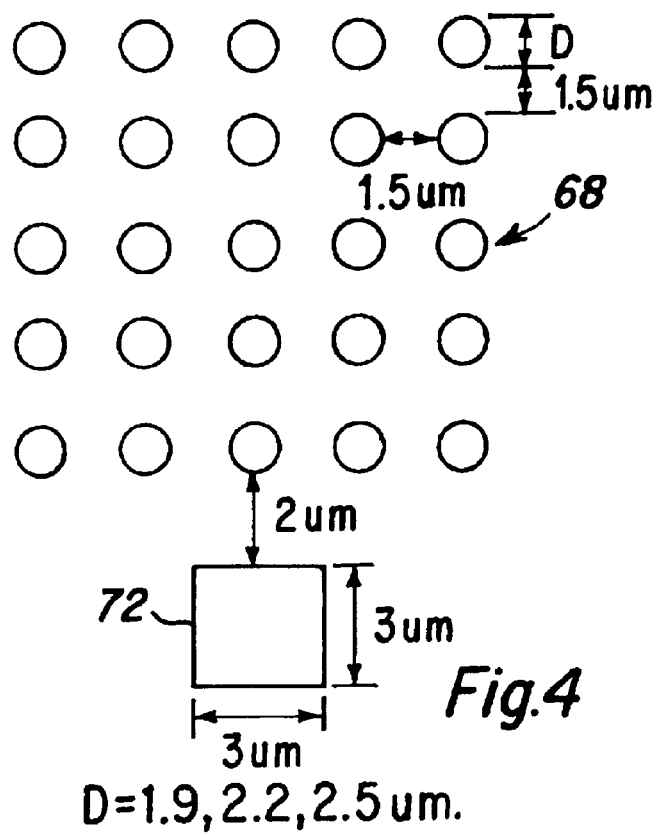
FIG. 4 depicts an array of relatively mid range diameter projections.

Now with reference to FIG. 4, depicting an array 68 of identically diametered projecting test features 12, the array 68 is generally square having a side dimension of approximately 20 $\mu$m such that its area is approximately 400 $\mu m^2$. In comparing the array of FIG. 4 with that of FIG. 3, it is seen that the array of FIG. 4 comprises five rows, wherein each row includes five projecting test features having the same diameter. The array of FIG. 4 is utilized for relatively mid-range diameter projecting test features. An array identifying symbol that is uniquely associated with the diameter of the test features of the array is preferably located in an area 72 proximate the array, to facilitate identification of the target array by a CDSEM.

Figure 5:
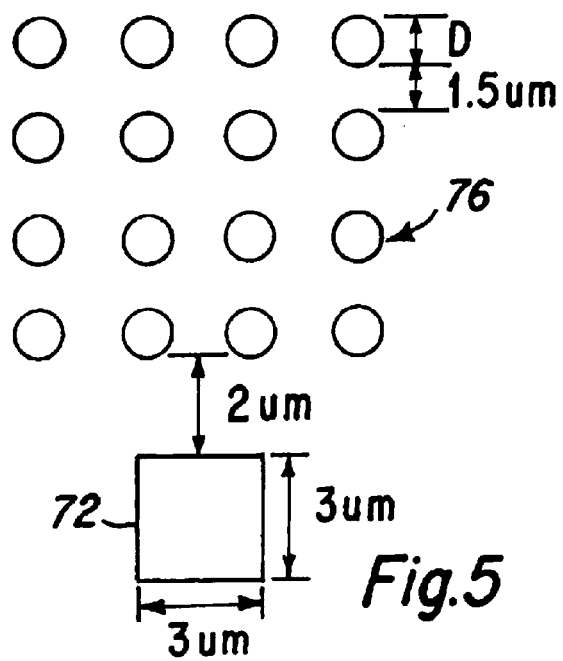
FIG. 5 depicts an array of relatively large diameter projections.

FIG. 5 depicts a further test array 76 that is generally square, having a side dimension of approximately 20 $\mu$m, such that its area is approximately 400 $\mu m^2$. The array 76 includes four rows of projecting test features, wherein each row includes four projecting test features. This array is generally suitable for larger diameter projecting test features, and an array identification symbol is also fabricated in an area 72 immediately below the array.

Further test array geometries are contemplated, such as an 8×8 array for projecting test features having a diameter of approximately 1 micron. It is desired to make all of the test arrays have approximately the same size, approximately 400 $\mu m^2$, such that it is easier for the operator to identify bright array squares utilizing an optical microscope.

Figure 6:
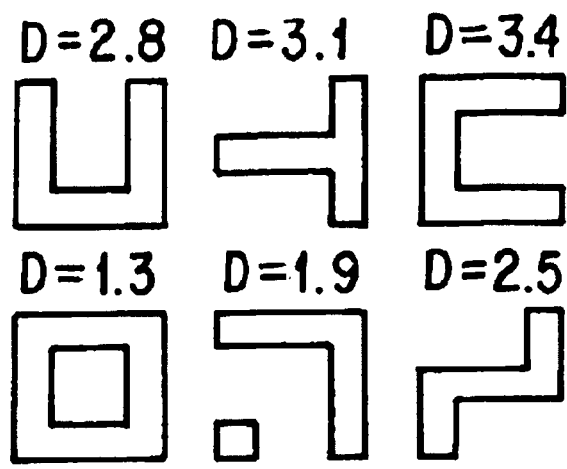
FIG. 6 depicts a set of array identification symbols designed for CDSEM pattern recognition.

As will now be understood, a different identification symbol is fabricated below each array, where the different symbol patterns 64, such as are depicted in FIG. 6, may be utilized to provide an identification symbol related to the diameter of the projecting test features formed in the array. While the 20 micron by 20 microns array is visible utilizing an optical microscope, the identification symbol pattern is generally too small to be visible utilizing the optical microscope. The identification symbol is however utilizable for pattern recognition during CDSEM measurement to identify the particular arrays for use in fine operator control of the CMP process as is described herebelow.

Figure 7:
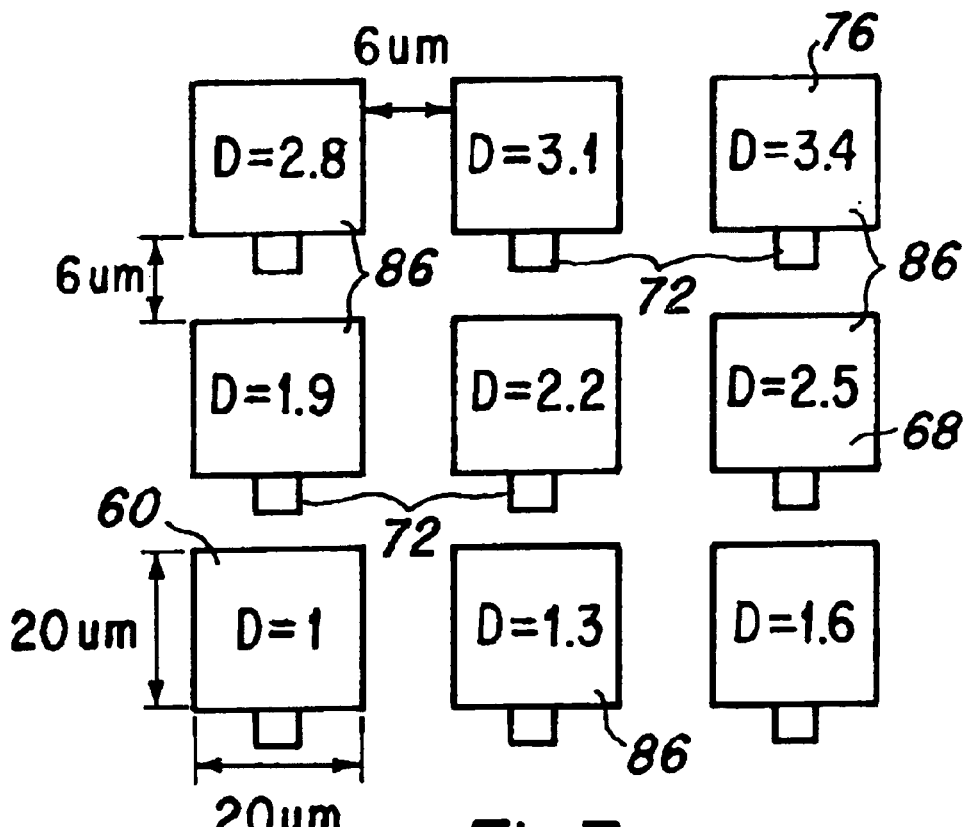
FIG. 7 depicts a proposed arrangement of a plurality of arrays.

It is therefore to be understood that a plurality or group of arrays are to be created upon the wafer surface, where each array, such as 60, 68, 76, has a size dimension that is large enough for viewing by an optical microscope, while the individual projecting test features of the array are too small to be optically discerned. For illustrative purposes, FIG. 7 is a depiction of a group of arrays 86, such as nine arrays, that are arranged in a particular pattern upon a wafer surface for optical microscope CMP process control. Specifically, FIG.

7 depicts an arrangement of nine arrays, where each array 86 is optically visible utilizing an optical microscope, and where the array 60 having the smallest diameter of projecting test features is located in the lower left hand corner, and arrays having progressively increasing diameter projecting test features are arranged increasingly to the right, then to the middle row, and then to the upper row, such that the array 76 having the largest diameter projecting test features is disposed in the upper right hand corner. This arrangement of test arrays provides nine optically visible features utilizing an optical microscope, where the individual projecting test features within each array are not visible utilizing the optical microscope. The present invention is not to be limited to such a grouped arrangement of the arrays.

A desirable enhancement of the present invention involves the utilization of a dark field optical microscope to view the test arrays. Significantly, when viewing the arrays of DLC coated projecting test features 12 with a dark field optical microscope, the arrays with test features in which the DLC has been removed appear to be bright white, whereas the arrays with test features having even a moderate amount of DLC thereon appear to be dark. A CMP process control implementation of the present invention can now be described.

Where a particular CMP process is to be undertaken for wafers having a particular structure, such as a delicate read sensor of a magnetic head, CMP test polishing is undertaken and analyzed utilizing a CDSEM device to determine a desired CMP polishing time which removes the unwanted material from the surface of the wafer without removing the delicate structure (read sensor) of the fabricated devices. A CMP polishing chart, such as is depicted in FIG. 2, is likewise developed for the particular CMP processing parameters that are being utilized in the CMP step. Utilizing the data from the chart, a plurality of projecting test feature diameters are determined which correspond to operator desired time intervals related to the CMP processing step, such as diameters that reflect 5 second polishing intervals that are close to the desired polishing time. Thereafter, in fabricating further wafers, a plurality of groups of test arrays, such as are depicted in FIGS. 3, 4 and 5, are fabricated upon the wafer surface in several widely separated locations, where each group of test arrays is arranged in an array grouping such as is depicted in FIG. 7. Thereafter, polishing is conducted and the operator checks the progress of the CMP polishing step by removing the wafer and viewing the grouped arrays utilizing a dark field optical microscope. Each of the test arrays in the group (such as FIG. 7) is large enough to be independently discernable utilizing the dark field optical microscope, and where polishing has been conducted for a particular period of time, such as perhaps 35 seconds, the lower two (smallest) diameter arrays may appear to be entirely bright white, indicating that the DLC on top of each of the individual projecting test features has been removed in the polishing. The middle row and the top row of test arrays all appear black. Thereafter, with further polishing being undertaken, the operator again removes the wafer and checks the individual groups of arrays. The second check may reveal that the first four (smallest to mid-diameter test features) arrays are bright white, where the remainder are dark. If the desired endpoint is perhaps the total brightness of the fifth array, while the sixth array appears dark, a few more seconds of polishing is required. However, should the operator remove a wafer and, upon checking, see that the group of arrays shows that perhaps eight arrays are bright white and only the remaining one is dark, the operator will realize that polishing has been conducted beyond the desired endpoint, and the wafer will probably need to be discarded. At this point, the operator may decide to view the disk utilizing the CDSEM device for a close, detailed analysis of the degree of polishing that has been performed. It may be determined that the operator should stop the polishing step when only the fourth array is bright white, or, conversely, that the polishing step should be continued until the seventh or eighth array is bright white. The CMP process time is then corrected accordingly for future wafers.

It may also then be necessary to create new groups of arrays on future wafers that have larger, or smaller diameter projecting test features to provide a revised range of CMP process control times that corresponds to the desired CMP process time for different generation device designs.

It is therefore to be understood that this invention combines both the control accuracy of the existing CDSEM inspection/measure methodology, together with the quicker and less expensive dark field optical microscope inspection for CMP process control. The use of the dark field optical microscope for CMP process control is quicker and relatively inexpensive as compared to the use of the CDSEM for process control. As a result, a shorter fabrication time and greater process throughput is achieved in the CMP process of the present invention. The overall benefit of this invention is that it provides a methodology that combines a quick and simple CMP process control at operator level utilizing a dark field optical microscope, together with the ability to achieve concise CMP process control and fine tuning utilizing a CDSEM device when it is required.

Therefore, while the present invention has been shown and described with regard to certain preferred embodiments, it will be understood that those skilled in the art will no doubt develop certain alterations and modifications thereto which nevertheless include the true spirit and scope of the invention. It is therefore intended that the following claims cover all such alterations and modifications.

We claim:

1. A wafer having a plurality of devices being fabricated thereupon, wherein said wafer is configured to undergo a chemical mechanical polishing (CMP) step on a surface of the wafer comprising:

a plurality of arrays wherein each array includes a plurality of test features that project from the wafer surface to be polished, wherein each projecting test feature is formed with a relatively hard upper surface layer; and wherein the plurality of projecting test features within an array have an identical diameter, and wherein the diameter of the projecting test features of each different array differs.

2. A wafer as described in claim 1, wherein said upper surface layer is comprised of diamond-like-carbon (DLC).

3. A wafer as described in claim 1, wherein each said projecting test feature has a diameter that is less than approximately 5 $\mu$m.

4. A wafer as described in claim 1, wherein each said array is formed with an array area of at least approximately 400 $\mu m^2$.

5. A wafer as described in claim 1, wherein each said array is formed of sufficient size to be viewable with an optical microscope, where the projecting test features within each array are too small to be viewable with an optical microscope.

6. A wafer as described in claim 1, wherein the diameter of the projecting test features within an array is associated with a known polishing time in which said upper surface layer of the test feature is removed by the polishing process.

7. A wafer as described in claim 6, wherein the different diameter of the projecting test features of each differing array corresponds to a particular polishing time increment.

8. A wafer as described in claim 7, wherein said polishing time increment is five seconds.

9. A wafer as described in claim 1, wherein said group of arrays includes nine arrays.

10. A wafer as described in claim 1, wherein each array within a group of arrays includes a unique identification symbol associated therewith.

11. A wafer as described in claim 1, wherein each array includes a plurality of projecting test features that are arranged in a plurality of rows and columns.

12. A process for the chemical mechanical polishing of a wafer surface, comprising:

forming a plurality of arrays upon a wafer surface, wherein each array includes a plurality of test features that project from the wafer surface to be polished, wherein each projecting test feature is formed with a relatively hard upper surface layer, wherein each said array includes a plurality of projecting test features having an identical diameter, and wherein the diameter of the projecting test features of each array differs;

polishing the wafer surface in a CMP step;

checking the progress of the CMP step by examining the wafer surface with an optical microscope to determine which of the arrays includes test features in which the upper surface layer of the test features has been removed by the CMP polishing; and stopping said CMP step when it is seen through the optical microscope that test features of a previously determined array have had their upper surface removed.

13. A process for the chemical mechanical polishing of a wafer surface as described in claim 12, wherein said upper surface layer is comprised of diamond-like-carbon (DLC).

14. A process for the chemical mechanical polishing of a wafer surface as described in claim 12, wherein each said projecting test feature has an effective diameter that is less than approximately 5 $\mu$m.

15. A process for the chemical mechanical polishing of a wafer surface as described in claim 12, including forming each said array with an array area of at least approximately 400 $\mu m^2$.

16. A process for the chemical mechanical polishing of a wafer surface as described in claim 12, including forming each said array of sufficient size to be viewable with an optical microscope, where the projecting test features within each array are too small to be viewable with an optical microscope.

17. A process for the chemical mechanical polishing of a wafer surface as described in claim 12, including forming the diameter of the projecting test features within an array to be associated with a known polishing time in which said upper surface layer of the test feature is removed by the polishing process.

18. A process for the chemical mechanical polishing of a wafer surface as described in claim 17, including forming the different diameter of the projecting test features of each differing array to correspond to a particular polishing time increment.

19. A process for the chemical mechanical polishing of a wafer surface as described in claim 18, wherein said polishing time increment is five seconds.

20. A process for the chemical mechanical polishing of a wafer surface as described in claim 12, including forming said group of arrays to include nine arrays.

21. A process for the chemical mechanical polishing of a wafer surface as described in claim 12, wherein each array within a group of arrays is formed with a unique identification symbol.

22. A process for the chemical mechanical polishing of a wafer surface as described in claim 12, wherein each array includes a plurality of projecting test features that are arranged in a plurality of rows and columns.

* * * * *